United States Patent
Verghese et al.

(10) Patent No.: US 10,027,184 B2
(45) Date of Patent: Jul. 17, 2018

(54) FOREIGN OBJECT DETECTION IN WIRELESS ENERGY TRANSFER SYSTEMS

(71) Applicant: WiTricity Corporation, Watertown, MA (US)

(72) Inventors: Simon Verghese, Arlington, MA (US); Morris P. Kesler, Bedford, MA (US); Katherine L. Hall, Arlington, MA (US); Herbert T. Lou, Carlisle, MA (US)

(73) Assignee: WiTricity Corporation, Watertown, MA (US)

( * ) Notice: Subject to any disclaimer, the term of this patent is extended or adjusted under 35 U.S.C. 154(b) by 154 days.

(21) Appl. No.: 15/170,397

(22) Filed: Jun. 1, 2016

(65) Prior Publication Data

US 2016/0276875 A1   Sep. 22, 2016

Related U.S. Application Data

(63) Continuation of application No. 13/608,956, filed on Sep. 10, 2012, now Pat. No. 9,442,172.

(Continued)

(51) Int. Cl.
*H01F 38/14* (2006.01)
*H01F 37/00* (2006.01)
(Continued)

(52) U.S. Cl.
CPC ............ *H02J 50/60* (2016.02); *B60L 11/182* (2013.01); *G01R 33/10* (2013.01); *G01V 3/10* (2013.01);
(Continued)

(58) Field of Classification Search
CPC .. H02J 50/00; H02J 50/12; H02J 7/025; H02J 17/00; H02J 5/005; H02J 50/60;
(Continued)

(56) References Cited

U.S. PATENT DOCUMENTS 645,576 A    3/1900 Tesla
649,621 A    5/1900 Tesla
(Continued)

FOREIGN PATENT DOCUMENTS

CA    142352      8/1912
CN    101807822   8/2010
(Continued)

OTHER PUBLICATIONS

Canadian Office Action for Canadian Application No. 2,848,040 dated Oct. 4, 2017 (5 pages).
(Continued)

*Primary Examiner* — Hal Kaplan
(74) *Attorney, Agent, or Firm* — Fish & Richardson P.C.

(57) ABSTRACT

A wireless energy transfer system includes a foreign object debris detection system. The system includes at least one wireless energy transfer source configured to generate an oscillating magnetic field. The foreign object debris may be detected by at least one field gradiometer positioned in the oscillating magnetic field. The voltage of the at least one field gradiometer may be measured using readout circuitry and a feedback loop based on the readings from the gradiometers may be used to control the parameters of the wireless energy source.

16 Claims, 10 Drawing Sheets

Related U.S. Application Data

(60) Provisional application No. 61/532,785, filed on Sep. 9, 2011.

(51) Int. Cl.

| | |
|---|---|
| H02J 50/60 | (2016.01) |
| G01R 33/10 | (2006.01) |
| H02J 17/00 | (2006.01) |
| G01V 3/10 | (2006.01) |
| B60L 11/18 | (2006.01) |
| H02J 50/12 | (2016.01) |
| H02J 7/02 | (2016.01) |
| H02J 5/00 | (2016.01) |
| H01F 27/28 | (2006.01) |

(52) U.S. Cl.
CPC .............. *H02J 7/025* (2013.01); *H02J 17/00* (2013.01); *H02J 50/12* (2016.02); *H01F 27/2804* (2013.01); *H01F 38/14* (2013.01); *H02J 5/005* (2013.01); *Y02T 10/7005* (2013.01); *Y02T 10/7072* (2013.01); *Y02T 90/122* (2013.01); *Y02T 90/14* (2013.01)

(58) Field of Classification Search
CPC ......... B60L 11/182; G01R 33/10; G01V 3/10; H01F 27/2804; H01F 38/14; Y02T 10/7005; Y02T 10/7072; Y02T 90/122; Y02T 90/14
USPC ...................................................... 307/104
See application file for complete search history.

(56) References Cited

U.S. PATENT DOCUMENTS

| | | | |
|---|---|---|---|
| 787,412 | A | 4/1905 | Tesla |
| 1,119,732 | A | 12/1914 | Tesla |
| 2,133,494 | A | 10/1938 | Waters |
| 3,517,350 | A | 6/1970 | Beaver |
| 3,535,543 | A | 10/1970 | Dailey |
| 3,780,425 | A | 12/1973 | Penn et al. |
| 3,871,176 | A | 3/1975 | Schukei |
| 4,088,999 | A | 5/1978 | Fletcher et al. |
| 4,095,998 | A | 6/1978 | Hanson |
| 4,180,795 | A | 12/1979 | Matsuda et al. |
| 4,280,129 | A | 7/1981 | Wells |
| 4,450,431 | A | 5/1984 | Hochstein |
| 4,588,978 | A | 5/1986 | Allen |
| 4,843,259 | A | 6/1989 | Weisshaupt |
| 5,027,709 | A | 7/1991 | Slagle |
| 5,033,295 | A | 7/1991 | Schmid et al. |
| 5,034,658 | A | 7/1991 | Hiering et al. |
| 5,053,774 | A | 10/1991 | Schuermann et al. |
| 5,070,293 | A | 12/1991 | Ishii et al. |
| 5,118,997 | A | 6/1992 | El-Hamamsy |
| 5,216,402 | A | 6/1993 | Carosa |
| 5,229,652 | A | 7/1993 | Hough |
| 5,287,112 | A | 2/1994 | Schuermann |
| 5,341,083 | A | 8/1994 | Klontz et al. |
| 5,367,242 | A | 11/1994 | Hulman |
| 5,374,930 | A | 12/1994 | Schuermann |
| 5,408,209 | A | 4/1995 | Tanzer et al. |
| 5,437,057 | A | 7/1995 | Richley et al. |
| 5,455,467 | A | 10/1995 | Young et al. |
| 5,493,691 | A | 2/1996 | Barrett |
| 5,522,856 | A | 6/1996 | Reineman |
| 5,528,113 | A | 6/1996 | Boys et al. |
| 5,541,604 | A | 7/1996 | Meier |
| 5,550,452 | A | 8/1996 | Shirai et al. |
| 5,565,763 | A | 10/1996 | Arrendale et al. |
| 5,630,835 | A | 5/1997 | Brownlee |
| 5,697,956 | A | 12/1997 | Bornzin |
| 5,703,461 | A | 12/1997 | Minoshima et al. |
| 5,703,573 | A | 12/1997 | Fujimoto et al. |
| 5,710,413 | A | 1/1998 | King et al. |
| 5,742,471 | A | 4/1998 | Barbee, Jr. et al. |
| 5,821,728 | A | 10/1998 | Sshwind |
| 5,821,731 | A | 10/1998 | Kuki et al. |
| 5,864,323 | A | 1/1999 | Berthon |
| 5,898,579 | A | 4/1999 | Boys et al. |
| 5,903,134 | A | 5/1999 | Takeuchi |
| 5,923,544 | A | 7/1999 | Urano |
| 5,940,509 | A | 8/1999 | Jovanovich et al. |
| 5,957,956 | A | 9/1999 | Kroll et al. |
| 5,959,245 | A | 9/1999 | Moe et al. |
| 5,986,895 | A | 11/1999 | Stewart et al. |
| 5,993,996 | A | 11/1999 | Firsich |
| 5,999,308 | A | 12/1999 | Nelson et al. |
| 6,012,659 | A | 1/2000 | Nakazawa et al. |
| 6,047,214 | A | 4/2000 | Mueller et al. |
| 6,066,163 | A | 5/2000 | John |
| 6,067,473 | A | 5/2000 | Greeninger et al. |
| 6,108,579 | A | 8/2000 | Snell et al. |
| 6,127,799 | A | 10/2000 | Krishnan |
| 6,176,433 | B1 | 1/2001 | Uesaka et al. |
| 6,184,651 | B1 | 2/2001 | Fernandez et al. |
| 6,207,887 | B1 | 3/2001 | Bass et al. |
| 6,232,841 | B1 | 5/2001 | Bartlett et al. |
| 6,238,387 | B1 | 5/2001 | Miller, III |
| 6,252,762 | B1 | 6/2001 | Amatucci |
| 6,436,299 | B1 | 8/2002 | Baarman et al. |
| 6,450,946 | B1 | 9/2002 | Forsell |
| 6,452,465 | B1 | 9/2002 | Brown et al. |
| 6,459,218 | B2 | 10/2002 | Boys et al. |
| 6,473,028 | B1 | 10/2002 | Luc |
| 6,483,202 | B1 | 11/2002 | Boys |
| 6,515,878 | B1 | 2/2003 | Meins et al. |
| 6,535,133 | B2 | 3/2003 | Gohara |
| 6,561,975 | B1 | 5/2003 | Pool et al. |
| 6,563,425 | B2 | 5/2003 | Nicholson et al. |
| 6,597,076 | B2 | 7/2003 | Scheible et al. |
| 6,609,023 | B1 | 8/2003 | Fischell et al. |
| 6,631,072 | B1 | 10/2003 | Paul et al. |
| 6,650,227 | B1 | 11/2003 | Bradin |
| 6,664,770 | B1 | 12/2003 | Bartels |
| 6,673,250 | B2 | 1/2004 | Kuennen et al. |
| 6,683,256 | B2 | 1/2004 | Kao |
| 6,696,647 | B2 | 2/2004 | Ono et al. |
| 6,703,921 | B1 | 3/2004 | Wuidart et al. |
| 6,731,071 | B2 | 5/2004 | Baarman |
| 6,749,119 | B2 | 6/2004 | Scheible et al. |
| 6,772,011 | B2 | 8/2004 | Dolgin |
| 6,798,716 | B1 | 9/2004 | Charych |
| 6,803,744 | B1 | 10/2004 | Sabo |
| 6,806,649 | B2 | 10/2004 | Mollema et al. |
| 6,812,645 | B2 | 11/2004 | Baarman |
| 6,825,620 | B2 | 11/2004 | Kuennen et al. |
| 6,831,417 | B2 | 12/2004 | Baarman |
| 6,839,035 | B1 | 1/2005 | Addonisio et al. |
| 6,844,702 | B2 | 1/2005 | Giannopoulos et al. |
| 6,856,291 | B2 | 2/2005 | Mickle et al. |
| 6,858,970 | B2 | 2/2005 | Malkin et al. |
| 6,906,495 | B2 | 6/2005 | Cheng et al. |
| 6,917,163 | B2 | 7/2005 | Baarman |
| 6,917,431 | B2 | 7/2005 | Soljacic et al. |
| 6,937,130 | B2 | 8/2005 | Scheible et al. |
| 6,960,968 | B2 | 11/2005 | Odendaal et al. |
| 6,961,619 | B2 | 11/2005 | Casey |
| 6,967,462 | B1 | 11/2005 | Landis |
| 6,975,198 | B2 | 12/2005 | Baarman |
| 6,988,026 | B2 | 1/2006 | Breed et al. |
| 7,027,311 | B2 | 4/2006 | Vanderelli et al. |
| 7,035,076 | B1 | 4/2006 | Stevenson |
| 7,042,196 | B2 | 5/2006 | Ka-Lai et al. |
| 7,069,064 | B2 | 6/2006 | Govorgian et al. |
| 7,084,605 | B2 | 8/2006 | Mickle et al. |
| 7,116,200 | B2 | 10/2006 | Baarman et al. |
| 7,118,240 | B2 | 10/2006 | Baarman et al. |
| 7,126,450 | B2 | 10/2006 | Baarman et al. |
| 7,127,293 | B2 | 10/2006 | MacDonald |
| 7,132,918 | B2 | 11/2006 | Baarman et al. |
| 7,147,604 | B1 | 12/2006 | Allen et al. |
| 7,180,248 | B2 | 2/2007 | Kuennen et al. |

(56) References Cited

U.S. PATENT DOCUMENTS

| | | |
|---|---|---|
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,868,588 B2 | 1/2011 | Altekruse et al. |
| 7,879,483 B2 | 2/2011 | Sakakibara |
| 7,880,337 B2 | 2/2011 | Farkas |
| 7,884,697 B2 | 2/2011 | Wei et al. |
| 7,885,050 B2 | 2/2011 | Lee |
| 7,893,564 B2 | 2/2011 | Bennett |
| 7,919,886 B2 | 4/2011 | Tanaka |
| 7,923,870 B2 | 4/2011 | Jin |
| 7,932,798 B2 | 4/2011 | Tolle et al. |
| 7,936,147 B2 | 5/2011 | Kook |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,030,887 B2 | 10/2011 | Jung |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,188,826 B2 | 5/2012 | Okada et al. |
| 8,193,769 B2 | 6/2012 | Azancot et al. |
| 8,212,414 B2 | 7/2012 | Howard et al. |
| 8,241,097 B2 | 8/2012 | Zhu et al. |
| 8,260,200 B2 | 9/2012 | Shimizu et al. |
| 8,269,375 B2 | 9/2012 | Sogabe et al. |
| 8,304,935 B2 | 11/2012 | Karalis et al. |
| 8,310,107 B2 | 11/2012 | Jin |
| 8,314,513 B2 | 11/2012 | Aoyama et al. |
| 8,324,759 B2 | 12/2012 | Karalis et al. |
| 8,334,620 B2 | 12/2012 | Park et al. |
| 8,344,688 B2 | 1/2013 | Yoda et al. |
| 8,362,651 B2 | 1/2013 | Hamam et al. |
| 8,369,905 B2 | 2/2013 | Sogabe et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,406,823 B2 | 3/2013 | Kondo et al. |
| 8,410,636 B2 | 4/2013 | Kurs et al. |
| 8,441,154 B2 | 5/2013 | Karalis et al. |
| 8,446,046 B2 | 5/2013 | Fells et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 2002/0032471 A1 | 3/2002 | Loftin et al. |
| 2002/0056233 A1 | 5/2002 | Gohara |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |

(56) References Cited

U.S. PATENT DOCUMENTS

| | | |
|---|---|---|
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0228833 A1 | 10/2007 | Stevens et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0290736 A1 | 11/2008 | Onishi et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0095449 A1 | 4/2009 | Bandai et al. |
| 2009/0096413 A1 | 4/2009 | Patovi et al. |
| 2009/0102292 A1 | 4/2009 | Cook et al. |
| 2009/0102296 A1 | 4/2009 | Green et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167253 A1 | 7/2009 | Muraoka et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0278523 A1 | 11/2009 | Yoda et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |

(56) References Cited

U.S. PATENT DOCUMENTS

| | | |
|---|---|---|
| 2009/0284245 A1 | 11/2009 | Kirby et al. |
| 2009/0284341 A1 | 11/2009 | Okada et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253153 A1 | 10/2010 | Kondo et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |

(56) References Cited

U.S. PATENT DOCUMENTS

| | | |
|---|---|---|
| 2011/0025265 A1 | 2/2011 | Mochida et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2011/0318618 A1 | 12/2011 | Yajima et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0049650 A1 | 3/2012 | Bella |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0146580 A1 | 6/2012 | Kitamura |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0175967 A1 | 7/2012 | Dibben et al. |
| 2012/0181875 A1 | 7/2012 | Wechlin et al. |
| 2012/0184338 A1 | 7/2012 | Kesler et al. |
| 2012/0187757 A1 | 7/2012 | Wechlin et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0235637 A1 | 9/2012 | Tanabe |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0063085 A1 | 3/2013 | Takada et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0169062 A1 | 7/2013 | Maikawa et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0049422 A1 | 2/2014 | Von Novak et al. |
| 2014/0070764 A1 | 3/2014 | Keeling |

FOREIGN PATENT DOCUMENTS

| | | |
|---|---|---|
| CN | 101983466 | 3/2011 |
| CN | 102239633 | 11/2011 |
| CN | 102439669 | 5/2012 |
| CN | 103329397 | 9/2013 |
| DE | 38 24 972 | 1/1989 |
| DE | 100 29147 | 12/2001 |
| DE | 200 16 655 | 3/2002 |
| DE | 102 21 484 | 11/2003 |
| DE | 103 04 584 | 8/2004 |

(56) References Cited

FOREIGN PATENT DOCUMENTS

| | | | |
|---|---|---|---|
| DE | 10 2005 03629 | 2/2007 | |
| DE | 10 2006 044057 | 4/2008 | |
| DE | 20 2009 009693 | 11/2010 | |
| DE | 10 2009 033 236 | 1/2011 | |
| DE | 10 2009 033 237 | 1/2011 | |
| DE | 10 2011 015980 | 10/2012 | |
| EP | 1 335 477 | 8/2003 | |
| EP | 1 521 206 | 4/2005 | |
| EP | 1 524 010 | 4/2005 | |
| EP | 2 357 716 | 8/2011 | |
| EP | 2 410 631 | 1/2012 | |
| EP | 2 482 294 | 8/2012 | ............ H01F 38/14 |
| FR | 2 968 616 | 6/2012 | |
| JP | 02-097005 | 4/1990 | |
| JP | 4-265875 | 9/1992 | |
| JP | H6-2975 | 1/1994 | |
| JP | 6-341410 | 12/1994 | |
| JP | H07-225251 | 8/1995 | |
| JP | 9-182323 | 7/1997 | |
| JP | 9-298847 | 11/1997 | |
| JP | 10-164837 | 6/1998 | |
| JP | H10-327539 | 12/1998 | ............ H02J 7/00 |
| JP | 11-75329 | 3/1999 | |
| JP | 11-188113 | 7/1999 | |
| JP | 2000-134830 | 5/2000 | |
| JP | 2001-309580 | 11/2001 | |
| JP | 2002-010535 | 1/2002 | |
| JP | 2003-179526 | 6/2003 | |
| JP | 2004-166459 | 6/2004 | |
| JP | 2004-201458 | 7/2004 | |
| JP | 2004-229144 | 8/2004 | |
| JP | 2005-57444 | 3/2005 | |
| JP | 2005-149238 | 6/2005 | |
| JP | 2006-074848 | 3/2006 | |
| JP | 2007-505480 | 3/2007 | |
| JP | 2007-266892 | 10/2007 | |
| JP | 2007-537637 | 12/2007 | |
| JP | 2008-17562 | 1/2008 | |
| JP | 2008-508842 | 3/2008 | |
| JP | 2008-206231 | 9/2008 | |
| JP | 2008-206327 | 9/2008 | |
| JP | 2008-295231 | 12/2008 | |
| JP | 2009-213295 | 9/2009 | |
| JP | 2009-219177 | 9/2009 | ............ H02J 7/00 |
| JP | 2009-273260 | 11/2009 | |
| JP | 2011-072074 | 4/2011 | |
| JP | 2012-504387 | 2/2012 | |
| JP | 2012-249401 | 12/2012 | ............ H02J 17/00 |
| JP | 2013-543718 | 12/2013 | |
| KR | 2003-0092970 | 12/2003 | ............ G01N 27/82 |
| KR | 10-2007-0017804 | 2/2007 | |
| KR | 10-2008-0007635 | 1/2008 | |
| KR | 10-2009-0122072 | 11/2009 | |
| KR | 10-2011-0050920 | 5/2011 | |
| SG | 112842 | 7/2005 | |
| WO | WO 92/17929 | 10/1992 | |
| WO | WO 93/23908 | 11/1993 | |
| WO | WO 94/28560 | 12/1994 | |
| WO | WO 95/11545 | 4/1995 | |
| WO | WO 96/02970 | 2/1996 | |
| WO | WO 98/50993 | 11/1998 | |
| WO | WO 00/77910 | 12/2000 | |
| WO | WO 03/092329 | 11/2003 | |
| WO | WO 03/096361 | 11/2003 | |
| WO | WO 03/096512 | 11/2003 | |
| WO | WO 2004/015885 | 2/2004 | |
| WO | WO 2004/038888 | 5/2004 | |
| WO | WO 2004/055654 | 7/2004 | |
| WO | WO 2004/073150 | 8/2004 | |
| WO | WO 2004/073166 | 8/2004 | |
| WO | WO 2004/073176 | 8/2004 | |
| WO | WO 2004/073177 | 8/2004 | |
| WO | WO 2004/112216 | 12/2004 | |
| WO | WO 2005/024865 | 3/2005 | |
| WO | WO 2005/060068 | 6/2005 | |
| WO | WO 2005/109597 | 11/2005 | |
| WO | WO 2005/109598 | 11/2005 | |
| WO | WO 2006/011769 | 2/2006 | |
| WO | WO 2007/008646 | 1/2007 | |
| WO | WO 2007/020583 | 2/2007 | |
| WO | WO 2007/042952 | 4/2007 | |
| WO | WO 2007/084716 | 7/2007 | |
| WO | WO 2007/084717 | 7/2007 | |
| WO | WO 2008/109489 | 9/2008 | |
| WO | WO 2008/118178 | 10/2008 | |
| WO | WO 2009/009559 | 1/2009 | |
| WO | WO 2009/018568 | 2/2009 | |
| WO | WO 2009/023155 | 2/2009 | |
| WO | WO 2009/023646 | 2/2009 | |
| WO | WO 2009/033043 | 3/2009 | |
| WO | WO 2009/062438 | 5/2009 | |
| WO | WO 2009/070730 | 6/2009 | |
| WO | WO 2009/126963 | 10/2009 | |
| WO | WO 2009/140506 | 11/2009 | |
| WO | WO 2009/149464 | 12/2009 | |
| WO | WO 2009/155000 | 12/2009 | |
| WO | WO 2010/030977 | 3/2010 | |
| WO | WO 2010/036980 | 4/2010 | |
| WO | WO 2010/039967 | 4/2010 | |
| WO | WO 2010/090538 | 8/2010 | |
| WO | WO 2010/090539 | 8/2010 | |
| WO | WO 2010/093997 | 8/2010 | |
| WO | WO 2010/104569 | 9/2010 | |
| WO | WO 2011/061388 | 5/2011 | |
| WO | WO 2011/061821 | 5/2011 | |
| WO | WO 2011/062827 | 5/2011 | |
| WO | WO 2011/112795 | 9/2011 | |
| WO | WO 2012/037279 | 3/2012 | |
| WO | WO 2012/170278 | 12/2012 | |
| WO | WO 2013/013235 | 1/2013 | |
| WO | WO 2013/020138 | 2/2013 | |
| WO | WO 2013/036947 | 3/2013 | |
| WO | WO 2013/059441 | 4/2013 | |
| WO | WO 2013/067484 | 5/2013 | |
| WO | WO 2013/113017 | 8/2013 | |
| WO | WO 2013/142840 | 9/2013 | |
| WO | WO 2014/004843 | 1/2014 | |

OTHER PUBLICATIONS

South Korean Office Action for South Korean Application No. 10-2014-7009317 dated Dec. 7, 2017 (10 pages including English Translation).

Australian Patent Examination Report No. 1 for Australian Patent Application No. 2012305688, dated May 11, 2016 (3 pages).

"Intel CTO Says Gap between Humans, Machines Will Close by 2050", *Intel News Release*, (See intel.com/.../20080821comp. htm?iid=S . . . ) (Printed Nov. 6, 2009).

"Physics Update, Unwired Energy", *Physics Today*, pp. 26, (Jan. 2007) (See http://arxiv.org/abs/physics/0611063.).

"In pictures: A year in technology", *BBC News*, (Dec. 28, 2007).

"Next Little Thing 2010 Electricity without wires", CNN Money (See money.cnn.com/galleries/2009/smallbusiness/0911/gallery. next_little_thing_2010.smb/) (dated Nov. 30, 2009).

Abe et al. "A Noncontact Charger Using a Resonant Converter with Parallel Capacitor of the Secondary Coil". IEEE, 36(2):444-451, Mar./Apr. 2000.

Ahmadian, M. et al., "Miniature Transmitter for Implantable Micro Systems", *Proceedings of the 25th Annual International Conference of the IEEE EMBS* Cancun, Mexico, pp. 3028-3031 (Sep. 17-21, 2003).

Aoki, T. et al., "Observation of strong coupling between one atom and a monolithic microresonator", Nature, vol. 443:671-674 (2006).

Apneseth et al. "Introducing wireless proximity switches" ABB Review Apr. 2002.

Aristeidis Karalis et al., "Efficient Wireless non-radiative mid-range energy transfer", *Annals of Physics*, vol. 323, pp. 34-48 (2008).

Baker et al., "Feedback Analysis and Design of RF Power Links for Low-Power Bionic Systems," *IEEE Transactions on Biomedical Circuits and Systems*, vol. 1(1):28-38 (Mar. 2007).

(56) References Cited

OTHER PUBLICATIONS

Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/1114/2, (Nov. 14, 2006) 2 pages.
Biever, C., "Evanescent coupling could power gadgets wirelessly", NewScientistsTech.com, http://www. newscientisttech.com/article.ns?id=dnl 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).
Boyle, A., "Electro-nirvana? Not so fast", MSNBC, http:/lcosmiclog.msnbc.msn.com/news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging the Wireless Way—Even physicists forget to recharge their cell phones sometimes.", PC Magazine, ABC News Internet Ventures, (Dec. 12, 2006) 1 page.
CHINAVIEW, ,"Scientists light bulb with 'wireless electricity'",www.Chinaview.cn, http://news.xinhuanet.com/english/2007-06/08/content_6215681.htm,Jun. 2007,1 page.
Cooks, G., "The vision of an MIT physicist: Getting rid of pesky rechargers", Boston.com, (Dec. 11, 2006) 1 page.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).
Esser et al., "A New Approach to Power Supplies for Robots", IEEE, vol. 27(5):872-875, (Sep./Oct. 1991).
Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).
Fenske et al., "Dielectric Materials at Microwave Frequencies", Applied Microwave & Wireless, pp. 92-100 (2000).
Fernandez, C. et al., "A simple dc-dc converter for the power supply of a cochlear implant", *IEEE*, pp. 1965-1970 (2003).

Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).
Fildes, J., "Physics Promises Wireless Power", (Science and Technology Reporter), BBC News, (Nov. 15, 2006) 3 pages.
Fildes, J., "The technology with impact 2007", BBC News, (Dec. 27, 2007) 3 pages.
Fildes, J., "Wireless energy promise powers up", BBC News, http://news.bbc.co.uk/2/hi/technology/6725955.stm, (Jun. 7, 2007) 3 pages.
Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).
Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D.H., "Power on a Chip", MIT Technology Review, (Nov. 2004).
Gary Peterson, "MIT WiTricity Not So Original After All", *Feed Line No. 9*, (See http://www.tfcbooks.com/articles/witricity.htm) printed Nov. 12, 2009.
Geyi, Wen, "A Method for the Evaluation of Small Antenna Q", IEEE Transactions on Antennas and Propagation, vol. 51(8):2124-2129 (Aug. 2003).
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).
Highfield, R., "Wireless revolution could spell end of plugs-",(Science Editor), Telegraph.co.uk, http://www. telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).
Hirai et al., "Practical Study on Wireless Transmission of Power and Information for Autonomous Decentralized Manufacturing System", IEEE, vol. 46(2):349-359, Apr. 1999.
Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
Infotech Online, "Recharging gadgets without cables", infotech.indiatimes.com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).

(56) References Cited

OTHER PUBLICATIONS

Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resonances", Science vol. 317, pp. 83-86 (Jul. 6, 2007).
Kurs, A. et al., "Simultaneous mid-range power transfer to multiple devices", Applied Physics Letters, vol. 96, No. 044102 (2010).
Kurs, A. et al.,"Optimized design of a low-resistance electrical conductor for the multimegahertz range", Applied Physics Letters, vol. 98:172504-172504-3 (Apr. 2011).
Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages (2003).
Lee, "RFID Coil Design," Microchip Technology Inc., AN678, 21 pages (1998).
Liang et al., "Silicon waveguide two-photon absorption detector at 1.5 µm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Median, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R. ,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
PRESSTV, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/ business/ticker/2007/06/mit_discoveiry_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).

Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", IEEE Spectrum, pp. 35-39 (May 2010).
Schneider, David, "Electrons Unplugged. Wireless power at a distance is still far away", IEEE Spectrum, pp. 35-39 (May 2010).
Schuder, J. C. et al., "An Inductively Coupled RF System for the Transmission of 1 kW of Power Through the Skin", IEEE Transactions on Bio-Medical Engineering, vol. BME-18, No. 4, pp. 265-273 (Jul. 1971).
Schuder, J. C., "Powering an Artificial Heart: Birth of the Inductively Coupled-Radio Frequency System in 1960", Artificial Organs, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", J. Opt. Soc. Am B, vol. 19, No. 9, pp. 2052-2059 (Sep. 2002).
Soljacic, M., "Wireless nonradiative energy transfer", Visions of Discovery New Light on Physics, Cosmology, and Consciousness, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", IEEE Transactions on Power Electronics, vol. 17:1080-1088 (Nov. 2002).
Tesla, Nikola, "High Frequency Oscillators for Electro-Therapeutic and Other Purposes", Proceedings of the IEEE, vol. 87:1282-1292 (Jul. 1999).
Tesla, Nikola, "High Frequency Oscillators for Electro-Therapeutic and Other Purposes", The Electrical Engineer, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).

(56) References Cited

OTHER PUBLICATIONS

Valtchev et al. "Efficient Resonant Inductive Coupling Energy Transfer Using New Magnetic and Design Criteria". IEEE, pp. 1293-1298, 2005.

Vandevoorde et al., "Wireless energy transfer for stand-alone systems: a comparison between low and high power applicability", Sensors and Actuators, vol. 92:305-311 (2001).

Vilkomerson, David et al., "Implantable Doppler System for Self-Monitoring Vascular Grafts", *IEEE Ultrasonics Symposium*, pp. 461-465 (2004).

Villeneuve, Pierre R. et al., "Microcavities in photonic crystals: Mode symmetry, tunability, and coupling efficiency", *Physical Review B*, vol. 54:7837-7842 (Sep. 15, 1996).

Yariv, Amnon et al., "Coupled-resonator optical waveguide: a proposal and analysis", *Optics Letters*, vol. 24(11):711-713 (Jun. 1, 1999).

Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).

Yoshihiro Konishi, *Microwave Electronic Circuit Technology*, Chapter 4, pp. 145-197 (Marcel Dekker, Inc., New York, NY 1998).

Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.

Zierhofer, Clemens M. et al., "High-Efficiency Coupling-Insensitive Transcutaneous Power and Data Transmission Via an Inductive Link", *IEEE Transactions on Biomedical Engineering*, vol. 37, No. 7, pp. 716-722 (Jul. 1990).

Chinese Office Action for Chinese Application No. 2012800496010 dated Dec. 21, 2015 (5 pages).

EP Search Report for EP Application No. 15 19 0252 dated Jan. 4, 2016 (11 pages).

EPO Communication for European Application No. 12 830 255.1 dated Apr. 28, 2015 (6 pages).

Supplementary European Search Report for Application No. 11831382 dated Jan. 26, 2015 (8 pages).

Supplementary European Search Report for European Application No. EP 12 83 0255 dated Apr. 8, 2015 (3 pages).

PCT/US2013/065963, International Application No. PCT/US2013/065963, International Preliminary Report on Patentability, dated Apr. 30, 2015, 11 pages.

PCT/US2013/065963, International Application No. PCT/US2013/065963, International Search Report and Written Opinion, dated Oct. 28, 2014, 14 pages.

Korean Office Action for Korean Application No. 10-2013-7009960 dated Mar. 7, 2016 (13 pages).

Office Action for Japanese Patent Application No. 2014-529952 dated Sep. 6, 2016 (12 pages).

Japanese Office Action for Japanese Application No. 2014-529952 dated Mar. 21, 2017 (5 pages).

Second Office Action from the Chinese Patent Office for Chinese Application No. 201280049601.0 dated Sep. 18, 2016 (4 pages).

Korean Official Notice of Preliminary Rejection for Korean Application No. 10-2013-7009960 dated Nov. 1, 2015 (12 pages).

Frickey et al., "Conversions Between S, Z, Y, h, ABCD, and T Parameters which are Valid for Complex Source and Load Impedances", IEEE Transactions on Microwave Theory and Techniques, vol. 42, No. 2, pp. 205-211 (Feb. 1994).

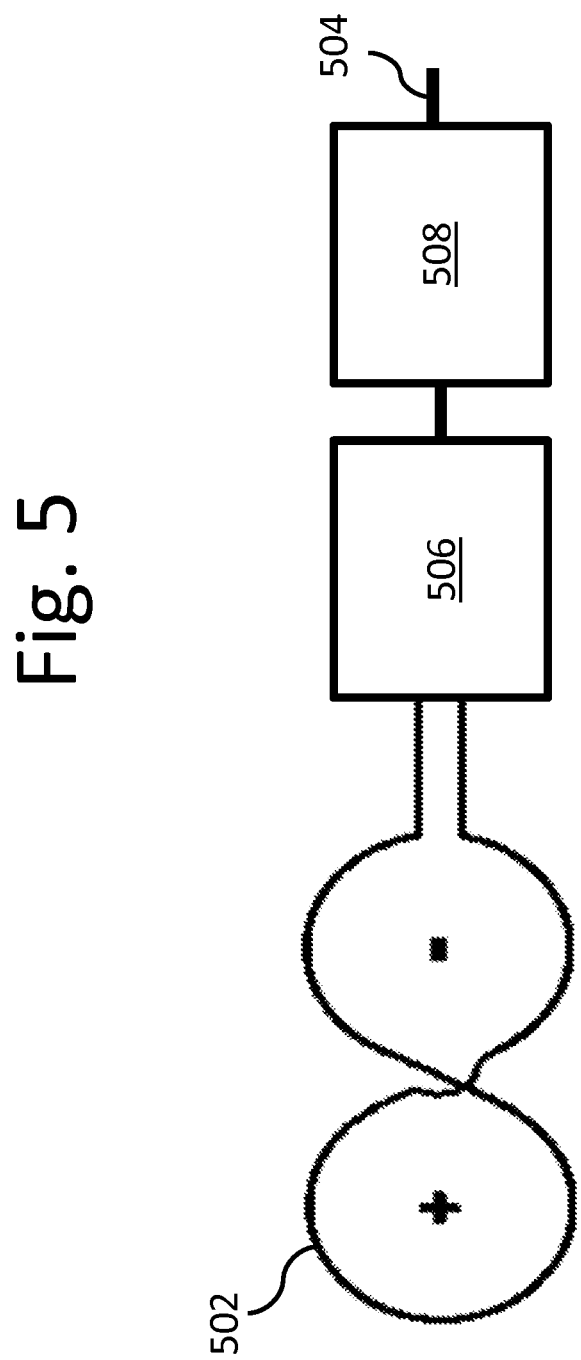

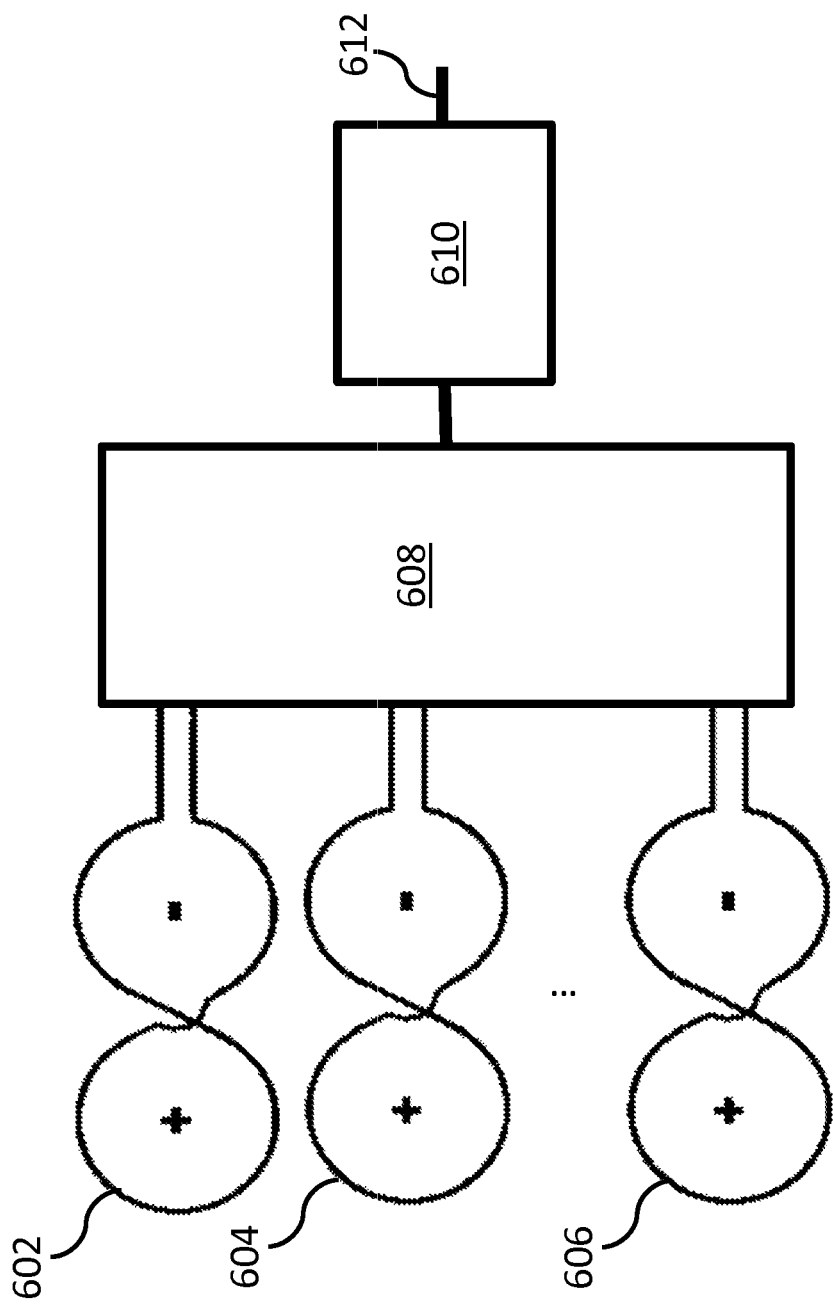

FOREIGN OBJECT DETECTION IN WIRELESS ENERGY TRANSFER SYSTEMS

CROSS-REFERENCE TO RELATED APPLICATIONS

This application is a continuation of, and claims priority to, U.S. patent application Ser. No. 13/608,956 filed Sep. 10, 2012, which claims the benefit of U.S. provisional patent application 61/532,785 filed Sep. 9, 2011. The contents of each of the above-identified applications are incorporated by reference in their entirety.

BACKGROUND

Field

This disclosure relates to wireless energy transfer and methods for detecting foreign object debris (FOD) on wireless power transmission systems.

Description of the Related Art

Energy or power may be transferred wirelessly using a variety of known radiative, or far-field, and non-radiative, or near-field, techniques as detailed, for example, in commonly owned U.S. patent application Ser. No. 12/613,686 published on May 6, 2010 as US 2010/010909445 and entitled "Wireless Energy Transfer Systems," U.S. patent application Ser. No. 12/860,375 published on Dec. 9, 2010 as 2010/0308939 and entitled "Integrated Resonator-Shield Structures," U.S. patent application Ser. No. 13/222,915 published on Mar. 15, 2012 as 2012/0062345 and entitled "Low Resistance Electrical Conductor," U.S. patent application Ser. No. 13/283,811 published on Oct. 4, 2012 as 2012/0248981 and entitled "Multi-Resonator Wireless Energy Transfer for Lighting," the contents of which are incorporated by reference.

Wireless charging systems that rely on an oscillating magnetic field between two coupled resonators can be efficient, non-radiative, and safe. Non-magnetic and/or non-metallic objects that are inserted between the resonators may not substantially interact with the magnetic field used for wireless energy transfer. In some embodiments, users of wireless power transfer systems may wish to detect the presence of these "foreign objects" and may wish to control, turn down, turn off, alarm, and the like, the wireless power transfer system. Metallic objects and/or other objects inserted between the resonators may interact with the magnetic field of the wireless power transfer system in a way that causes the metallic and/or other objects to perturb the wireless energy transfer and/or to heat up substantially. In some embodiments, users of wireless power transfer systems may wish to detect the presence of these "foreign objects" and may wish to control, turn down, turn off, alarm, and the like, the wireless power transfer system.

Foreign Object Debris (FOD) positioned in the vicinity of wireless power transmission systems can be benign and/or may interact with the fields used for energy transfer in a benign way. Examples of benign FOD may include dirt, sand, leaves, twigs, snow, grease, oil, water, and other substances that may not interact significantly with a low-frequency magnetic field. In embodiments, FOD may include objects that may interact with the fields used for wireless energy transfer in a benign way, but that may be restricted from the region very close to the resonators of the wireless transfer systems because of perceived danger, or out of a preponderance of caution. A common example of this type of FOD is a cat that may wish to sleep between the coils of a wireless EV charging system for example. In embodiments, some FOD may interact with the magnetic field in a way that may perturb the characteristics of the resonators used for energy transfer, may block or reduce the magnetic fields used for energy transfer, or may create a fire and or burning hazard. In some applications special precautions may be necessary to avoid combustible metallic objects becoming hot enough to ignite during high-power charging. Some metallic objects can heat up and have enough heat capacity to cause a burn or discomfort to a person who might pick them up while they are still hot. Examples include tools, coils, metal pieces, soda cans, steel wool, food (chewing gum, burgers, etc.) wrappers, cigarette packs with metal foil, and the like.

Thus what are needed are methods and designs for detecting or mitigating the effects of FOD in the vicinity of the wireless energy transfer system.

SUMMARY

In accordance with exemplary and non-limiting embodiments, a foreign object debris detection system may measure perturbations in the magnetic field around the resonators of a wireless energy transfer system using magnetic field sensors and/or gradiometers. The sensors and/or gradiometers may be positioned in the magnetic field of a wireless energy transfer system. The sensors and/or gradiometers may comprise loops of wire and/or printed conductor traces forming loops, figure-8 loops, and/or structures comprising one loop or multiple loops that generate an electrical signal proportional to the amount of magnetic flux crossing its surface. The loop and/or loops may be connected to high-input-impedance readout circuitry. The readout circuitry may measure the voltage and/or the current and/or the relative phase of the voltages and/or currents in the loops. In embodiments the system may include multiple layers of loops to increase the detection probability of FOD. In embodiments, the loops may be designed to operate without significantly affecting characteristics of the wireless power transfer system such as the perturbed quality factors of the resonators, the efficiency of the energy transfer, the amount of power transferred, the amount of heat generated by the system, and the like.

In accordance with exemplary and non-limiting embodiments, there is provided a wireless energy transfer system may comprise foreign object debris detection system. The system may include at least one wireless energy transfer source configured to generate an oscillating magnetic field. The foreign object debris may be detected by a field gradiometer positioned in the oscillating magnetic field. The voltages and/or currents of the field gradiometers may be measured using readout circuitry and a feedback loop based on the readings from the gradiometers may be used to control the parameters of the wireless energy source.

BRIEF DESCRIPTION OF FIGURES

FIG. 5 shows a FOD detector connected to a readout circuit.

FIG. 6 shows an array of FOD detectors connected to readout circuitry.

DETAILED DESCRIPTION

Methods for mitigating FOD risks can be categorized as passive mitigation techniques and active mitigation techniques. Passive mitigation techniques may be used to prevent FOD from entering or remaining in the regions of high magnetic field. Passive mitigation techniques may lower the likelihood of FOD interacting hazardously with magnetic fields. Active mitigation techniques may be used detect and react to the presence of FOD.

Passive Mitigation Techniques

Passive mitigation techniques may be used to keep FOD from entering the regions between resonators or specific regions of high magnetic field, thereby preventing the interaction of the FOD with the magnetic fields.

By way of additional exemplary embodiments, the design of a resonator cover in a wireless power transfer system may provide a passive FOD mitigation technique. In embodiments the enclosure of a source and/or device and/or repeater resonator may be shaped to prevent FOD from coming close to the areas of the resonators and/or the resonator coils where the magnetic field may be large. A resonator enclosure may be designed to be curved, angled, or shaped to force any FOD on the cover to roll off the cover and away from the resonator and/or high magnetic fields. The resonator enclosure may be shaped or positioned to allow gravity to pull objects away from the resonators. In other embodiments the enclosures and position of the resonators may be designed to use other natural or omnipresent forces to move FOD away. For example, the force of water currents, wind, vibration, and the like may be used to prevent FOD from accumulating or staying in unwanted regions around resonators. In embodiments, the resonators may be arranged to be substantially perpendicular to the ground so that objects may not naturally rest and accumulate on the resonators. In embodiments, the resonator enclosure may include a keep-out zone providing for a minimum distance between FOD and the resonator components. The keep-out zone may be sufficiently large to ensure that the fields at the outside of the keep-out zone are sufficiently small to not cause safety or performance concerns.

Figure 1:
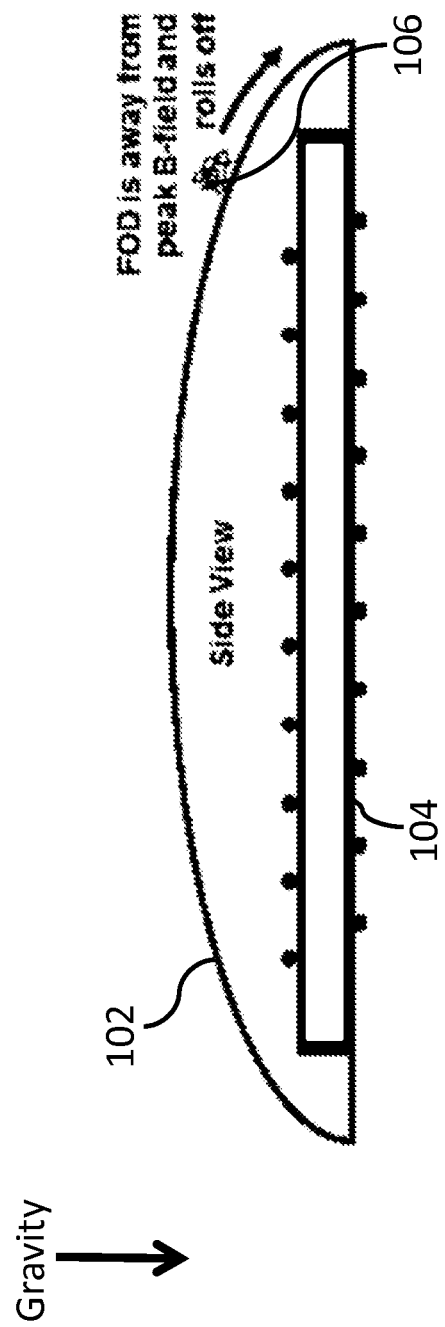
FIG. 1 shows a side view of a resonator with a resonator cover providing passive FOD mitigation.

An example resonator cover providing a degree of passive FOD protection is shown in FIG. 1. A magnetic resonator 104 of a wireless power transfer system may be surrounded with or enclosed by or placed under a shaped cover 102. The cover 102 may be shaped to force FOD 106 to roll down the cover 102 due to the force of gravity. The shape of the cover 102 may prevent FOD 106 from accumulating on top of the cover 102 and/or in the vicinity of the resonator 104 by forcing any FOD to the sides of the resonator and/or away from the regions surrounding the resonator where the magnitude of the magnetic fields is high enough to cause a hazardous condition due to heating of the FOD. In embodiments, the FOD may be forced far enough away from the high field regions to no longer pose a risk of being heated and/or ignited by the fields.

In other exemplary and non-limiting embodiments, a passive FOD technique may include sizing the resonators and/or resonator components to reduce the maximum magnetic field density anywhere in the region of wireless power exchange below a desired limit. In embodiments, relatively large resonator coils may be used to mitigate a subset of FOD risks. For a fixed level of power transfer the use of larger resonator coils may be used to reduce the magnetic field strength per unit area required to transfer a certain amount of power wirelessly. For example, the maximum magnetic field strength generated by a source may be reduced below a threshold where heating or other hazards may be known to occur. Passive mitigation techniques may not always be possible or practical or sufficient. For example, reducing a FOD hazard by increasing a resonator size may not be practical owing to the system cost restraints or to the desire to integrate a resonator into a system of a specified volume. However, even in applications where a completely passive technique may not be possible, practical and/or sufficient, passive mitigation techniques may be used to at least partially reduce the FOD risk and may be complementary to active mitigation techniques.

Active Mitigation Techniques

In accordance with exemplary and non-limiting embodiments, an active mitigation technique for FOD may include a detector system that may detect metallic objects, hot objects, perturbations in resonator parameters, and/or perturbations in magnetic field distributions.

In accordance with exemplary and non-limiting embodiments, FOD objects, such as metallic objects, may be of sufficient size, extent, and/or material composition to perturb the efficiency or power transfer capabilities of a wireless energy transfer system. In such cases, the presence of said FOD objects may be determined by examining the change in one or more of the voltage, current, and/or power associated with the source resonator and/or device resonator and/or repeater resonator of a wireless power system. Some FOD objects may perturb the parameters of the resonators used for energy transfer and/or may perturb the characteristics of the energy transfer. A FOD object may change the impedance of a resonator for example. In accordance with exemplary and non-limiting embodiments, these perturbations may be detected by measuring the voltage, current, power, phase, frequency, and the like of the resonators and the wireless energy transfer. Changes or deviations from expected or predicted values may be used to detect the presence of FOD. In an exemplary embodiment, dedicated FOD sensors may not be needed to detect and react to FOD in a wireless power system.

In accordance with exemplary and non-limiting embodiments, FOD objects may only weakly perturb the wireless energy transfer and may not be substantially detectable by monitoring electrical parameters of the resonators and/or the characteristics of the wireless energy transfer. Such objects can still create a hazard, however. For example, a FOD object that only weakly interacts with the magnetic field may still heat up substantially. An example of a FOD object that may only weakly interact with the magnetic field but that may experience significant heating is a metal-foil-and-paper wrapper such as is often found in chewing gum and cigarette packages and as is often used to wrap food from fast food establishments such as Burger King and Kentucky Fried Chicken. When placed between the resonators of a 3.3-kW wireless energy vehicle charging system, a chewing gum wrapper may not be detectable by examining the electrical parameters associated with the resonators and/or the energy transfer system. However, said wrapper may still absorb enough power to rapidly heat and for the paper to eventually burn.

In accordance with exemplary and non-limiting embodiments, an active mitigation system for FOD may comprise temperature sensors to detect hot spots, hot areas, and/or hot objects near by the wireless energy transfer system. A system may comprise any number of temperature sensors, infrared detectors, cameras, and the like to detect a heat source, heat gradient and the like around the energy transfer system. In embodiments, hot object sensing may be used alone or in addition to other active and passive mitigation techniques and can be used to further improve the detectability of heated FOD and/or reduce the false-alarm rate of other active FOD systems.

In accordance with exemplary and non-limiting embodiments, an active mitigation system for FOD objects that only weakly perturb the magnetic field between two resonators may comprise sensors for measuring small changes in the magnetic field in the proximity of the FOD objects. For example, a metal-foil-and-paper chewing gum wrapper may not substantially alter the magnetic flux between two resonators, but it might substantially alter the magnetic flux through a much smaller sensor coil or loop if it covered and/or blocked any portion of the coil or loop area. In embodiments, local disturbances in the magnetic field caused by the presence of FOD may be detected by measuring magnetic field changes, variations, gradients, and the like, in the vicinity of the FOD.

Figure 2:
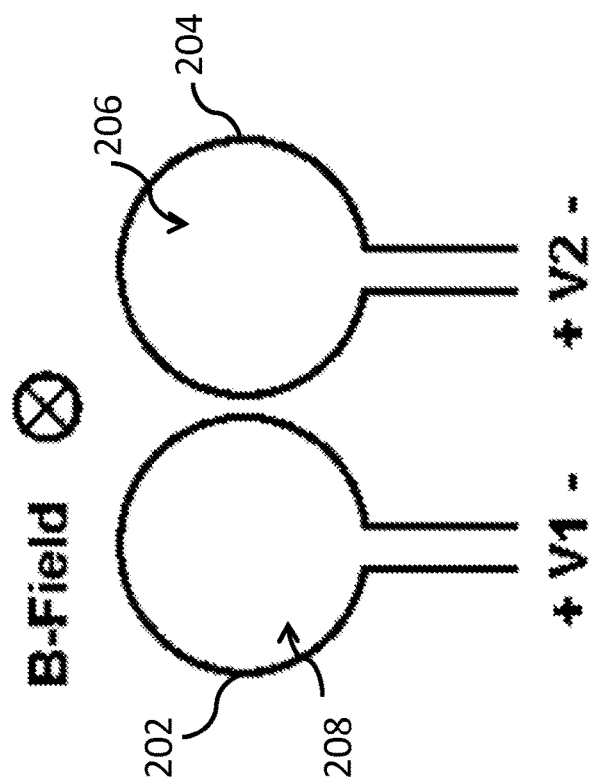
FIG. 2 two loops of wire that may be used as individual field sensors and that may be fashioned into a gradiometer that senses the difference in the magnetic flux capture by the two individual field sensors.

In accordance with exemplary and non-limiting embodiments, a FOD sensor may be realized using two small wire loops 202, 204 as shown in FIG. 2. Such a sensor may be placed on or near the resonators used for wireless energy transfer. During operation the wireless energy transfer system generates a magnetic field that passes through the two loops. Each individual loop develops a voltage proportional to the amount of magnetic flux threading the inside of each loop 206, 208. The difference between the voltages developed by the two loops is, to first order, proportional to the gradient of the magnetic field in proximity to the loops. If the two loops are placed in a region of uniform field and the loops are substantially similar, then the difference between the voltages developed by the two loops may be very small. If, for example, a chewing gum wrapper is placed so that it partially covers one of the loops but not the other, then the difference in voltage developed by the two loops will be larger than when the wrapper was not present because the metallic foil of the gum wrapper may deflect or/or absorb some of the magnetic flux that would have normally passed through that loop. In embodiments, the output from the two loops may be subtracted from each other so that the combination of loops produces a small signal when the sensed field is substantially uniform, and a measurably larger signal when there is a gradient in the field between the two loops. When the loops and/or coils are configured to generate a signal in the presence of a field gradient, they may be referred to as being arranged as a gradiometer. Note the signals from the loops may be subtracted using analog circuitry, digital circuitry and/or by connected the loops together in a specific configuration. The sensitivity of the sensor and/or gradiometer may be related to the magnitude and/or phase of the voltage difference between the two loops.

In accordance with exemplary and non-limiting embodiments, the sensitivity of the sensor and/or gradiometer may be adjusted to preferentially detect objects of a given size, or above a given size. The sensitivity may be adjusted to reduce false detection rates, to lower the noise of the detection system, and/or to operate over a range of frequencies. In embodiments the size and shape of the loops may be adjusted to adjust the sensitivity of the sensor. The loops may be adjusted to comprise more turns and or to comprise additional loops, such as four loops, or eight loops for example. In embodiments, the loops may be positioned to have rotational symmetry or they may be arranged in a linear arrangement or they may be shaped to fill a region of any size and shape.

In embodiments where the field density may be non-uniform in the locations where gradiometers may be placed and/or where other gradiometer and/or loop designs may be implemented, the presence of metallic objects may result in amplitude and/or phase changes in the waveform corresponding to the difference between the two loop voltages. In embodiments, the loops may have a plurality of turns. In accordance with exemplary and non-limiting embodiments, the loop areas 206, 208 may be sized according to the magnetic field strength of the wireless energy transfer system, the desired sensitivity of the detection method, the complexity of the system and the like. If the metallic FOD is substantially smaller than the loop area, only a weak signal may arise when the FOD is present. This weak signal may risk being overwhelmed by noise or interfering signals. If the loop is sized to be on the order of (e.g. within a factor of 3) of the minimum FOD size to be detected, then the signal may be sufficiently large for detection with low false-alarm rate. In embodiments, a FOD sensor and/or gradiometer may comprise one or more loops of different sizes, shapes and/or arrangements. In embodiments, a FOD sensor may comprise regions with one sensor, more than one sensor or no sensor.

In accordance with exemplary and non-limiting embodiments, another way to measure a field gradient in the vicinity of a metallic object may be to create a coil (also referred to as a loop) in a fashion that directly outputs a voltage that is proportional to the local gradient in the magnetic field. Such a coil serves the purpose of the two coils depicted in FIG. 2, but requires only one voltage measurement. If, for example, one were to double the area of one of the loops depicted in FIG. 2 and then twist it into a figure-8 shape where each lobe of the figure-8 had approximately equal area, but the current induced in each loop by the local magnetic field traveled in the opposing directions, then the voltage developed across its two terminals would be proportional to the difference in magnetic flux between the two lobes. FIGS. 3A-3D depicts some exemplary configurations of twisted loops that may be capable of directly outputting a voltage that is proportional to the local gradient in the magnetic field.

Figure 3A:
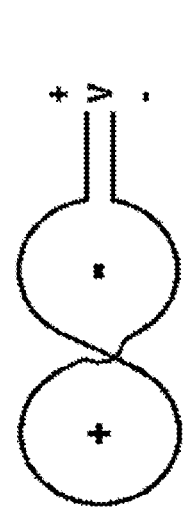
FIG. 3A shows a two-lobe configuration of two small conductor loops arranged to have opposed magnetic dipoles, (such a structure may be referred to as a magnetic quadrupole); 3B shows a 4-lobe configuration of aligned magnetic quadrupoles; 3C shows a 4-lobe configuration of opposed quadrupoles, sometimes referred to as an octupole; and 3D shows a 4-lobe configuration extending in a linear dimension. The "+" and "−" signs indicate the direction of the magnetic dipole of each loop, in a relative reference frame
Figure 3B:
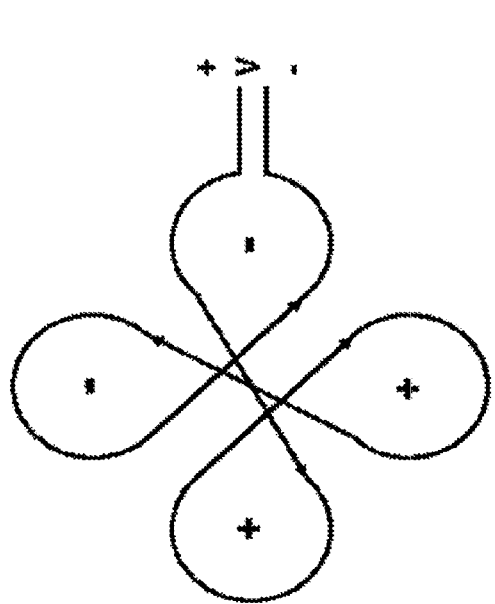
Figure 3C:
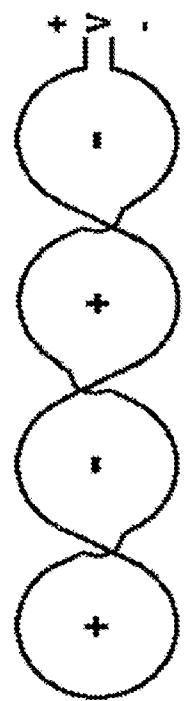
Figure 3D:
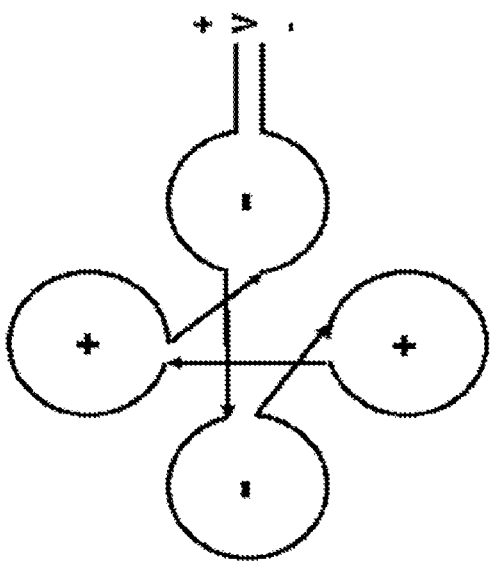

The two loops shown in FIG. 2 may be referred to as magnetic dipoles and the loops in FIG. 3A may be referred to as gradiometers and/or magnetic quadrupoles and the loops in FIG. 3B as gradiometers and/or octupoles, respectively. The quadrupole configuration may develop a voltage proportional to the magnetic field gradient in the left-to-right orientation. The 4-lobe configurations can be configured to measure field gradients (FIG. 3B), and gradients of field gradients (FIG. 3C). FIG. 3D is representative of embodiments where multiple lobes may extend along a linear dimension. In embodiments, higher-order multipoles with an even number of lobes can also be configured to measure spatial perturbations to the magnetic field. In embodiments, the lobes depicted in FIGS. 3A-3D may use multiple turns of conductor.

Each of these configurations can accomplish the goal of measuring magnetic field perturbations due to the presence of metallic FOD. The configurations with multiple lobes may have an advantage in covering more area without substantially reducing the likelihood of detecting FOD of similar characteristic size to the lobes.

Figure 4B:
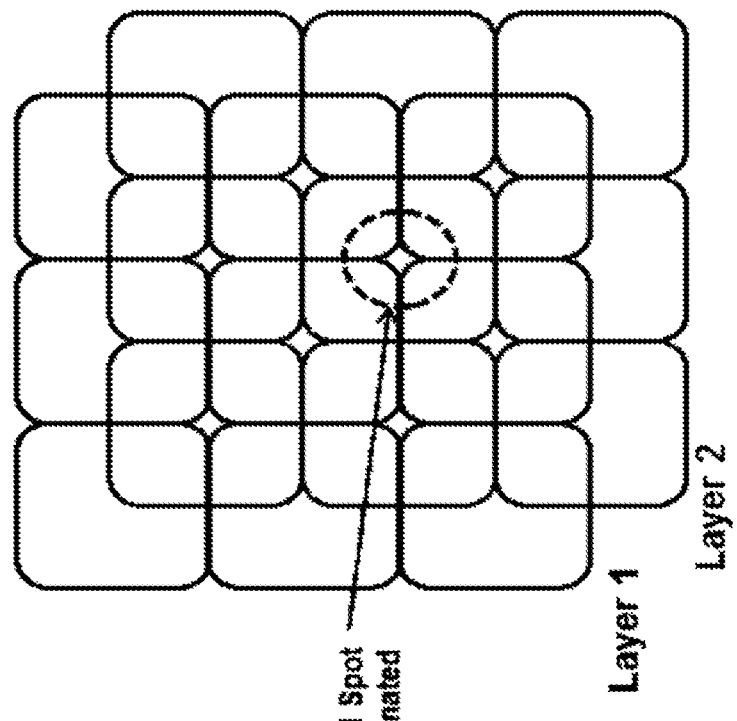
FIG. 4A shows a FOD detector array comprising loops with a square shape to achieve high area-fill factor; and 4B shows an embodiment with two offset arrays, an arrangement that may be used to eliminate blind spots.
Figure 4A:
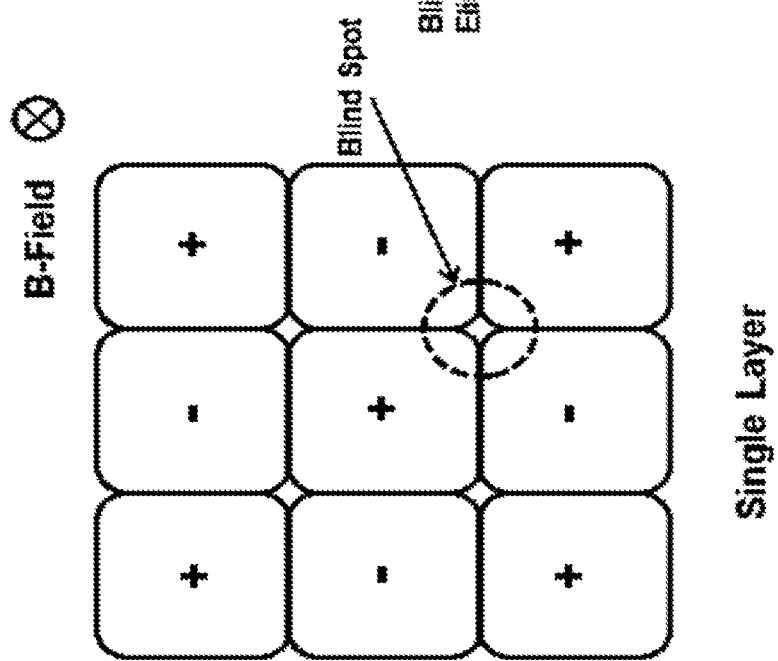

The loop configurations depicted in FIG. 2 and FIGS. 3A-3D are depicted as circular to illustrate the direction of the induced current in the presence of an oscillating magnetic field. The plus and minus signs indicate whether the induced current flows mostly counter-clock-wise or clockwise. Shapes other than circles may be better suited for arrays with high-area fill factor. Examples include squares, rectangles, hexagons, and other shapes that tile with little interstitial space in between them. FIG. 4A shows an example of square-shaped coils where the array is assumed to extend further than shown and to have an equal number of plus and minus loops. The wires of the coils may be connected so that the induced currents flow in the directions indicated by the plus and minus signs.

For the configuration shown in FIG. 4A a symmetrical piece of FOD can be placed in a position between adjacent loops so that the field perturbation may not generate a detectable magnetic field gradient. Such a "blind spot" is depicted in FIG. 4A. In accordance with exemplary and non-limiting embodiments, a second layer of arrayed loops may be placed above a first layer and may be offset laterally as shown in FIG. 4B. The offset may be chosen so that the "blind spots" of the first layer of sensors correspond to locations of maximum detectability for the second layer. In embodiments, the offset may be any offset than improves the likelihood of detection of the FOD relative to the single array detection probability. In this way, the likelihood may be reduced of having substantial blind spots where a piece of FOD may not be detectable. Similar schemes of one or more offset arrays can achieve roughly the same advantage in reducing blind spots. The orientations of the loops in multiple arrays may also be changed to handle non-uniform magnetic fields.

In embodiments the individual loops or lobes of the dipoles, quadrupoles, octupoles, and the like may be of multiple sizes or of nonuniform sizes. In embodiments where the gradiometer may cover areas of nonuniform magnetic field the loops may be sized to ensure a minimal voltage at the output of the gradiometer loops when no FOD is present. The loops may be sized such that a larger loop is positioned in an area of weaker magnetic field and the smaller loops are positioned in the areas of higher magnetic field. In embodiments the loops may be sized such that a larger loop is positioned in an area of more uniform magnetic field and a smaller loop is positioned in an area of less uniform magnetic field.

In accordance with exemplary and non-limiting embodiments, an array of FOD sensors may comprise multiple types of sensors. In embodiments, a FOD sensor may comprise single loop sensors and/or dipole gradiometers and/or quadrupole gradiometers and/or octupole gradiometers and so on. Some areas of the FOD sensor may comprise no gradiometers. A FOD sensor may comprise temperature sensors, organic material sensors, electric field sensors, magnetic field sensors, capacitive sensors, magnetic sensors, motion sensors, weight sensors, pressure sensors, water sensors, vibration sensors, optical sensors, and any combination of sensors.

Active FOD Detection Processing

The coil configurations described above (FIG. 2 to FIG. 4) may develop an oscillating voltage in the presence of an oscillating magnetic field that is non-uniform because of, for example, the presence of FOD. In accordance with exemplary and non-limiting embodiments, a read-out amplifier connected to a given coil may have a high input impedance. This arrangement may prevent a substantial circulating current from developing in the sensor coil which could, in turn, spoil the Q-factor of the resonators used for wireless energy transfer. In embodiments, the loops, coils, gradiometers and the like may be connected to amplifiers and/or filters and/or analog-to-digital converters and/or operational amplifiers, and or any electronic component that may be arranged to have high input impedance. In embodiments, a FOD sensor may comprise a conducting loop and a high input impedance electronic component.

In accordance with exemplary and non-limiting embodiments, each conductor pair from each coil (loop, sensor, gradiometer) in an array may be connected to a readout amplifier and/or an analog-to-digital converter as shown in FIG. 5. Each loop conductor 502 may be connected to an amplifier 506 and/or an analog-to-digital converter 508 and may produce an output 504 that may be used by other elements of a wireless energy transfer system or as an input to a processing element (not shown) such as a microprocessor to store and analyze the output of the coil, loop, sensor and/or gradiometer.

In other embodiments, the voltage on each coil in an array may be measured in sequence or may be multiplexed in a way that allows fewer read-out amplifiers or analog-to-digital converters to sample the array as shown in FIG. 6. An array of loops of gradiometers 602, 604, 606 may be connected to a multiplexed amplifier 608 and connected to one or more digital-to-analog converters 610. The output of the digital-to-analog converter 612 may be used by other elements of the wireless energy transfer system or as an input to a processing element (not shown) such as a microprocessor to store and analyze the output of the gradiometer.

In embodiments, each conductor pair of a sensor and/or gradiometer loop may be connected to active or passive filter circuitry to provide a high terminating impedance at very high or very low frequencies.

The voltage on a given coil may be sampled at increments that allow a processor to determine the amplitude and phase of the induced waveform relative to a reference waveform. In embodiments, the voltage on a given coil may be sampled at least twice per period of oscillation (i.e. at or above the Nyquist rate). In embodiments, the voltage on a given coil may be sampled less frequently (i.e. in higher-order Nyquist bands). The voltage waveform may be analog filtered or conditioned before sampling to improve the signal-to-noise ratio or to reduce harmonic content of the signals to be sampled. The voltage waveform may be digitally filtered or conditioned after sampling.

The time-sampled electrical signal from the FOD detector coils may be processed to determine the amplitude and phase with respect to a reference signal. The reference signal may be derived from the same clock used to excite the resonators used for wireless energy transfer.

Figure 7:
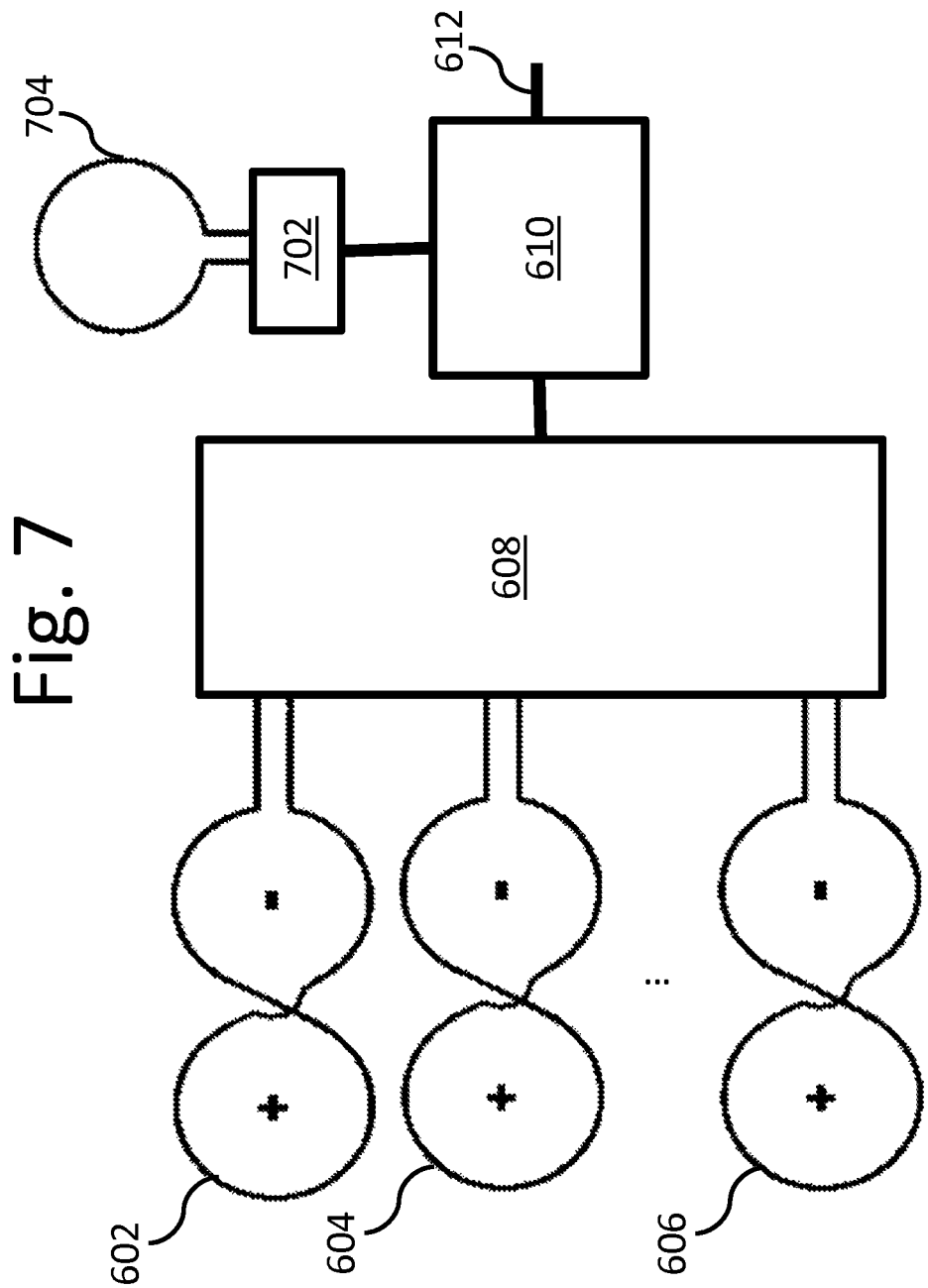
FIG. 7 shows an array of FOD detectors connected to readout circuitry and a synchronization loop.

In some embodiments the FOD detection system may include a separate frequency, field magnitude, and/or phase sampling loop 704 and electronics 702 to synchronize the sensor and/or gradiometer readings to the oscillating magnetic fields of the wireless energy transfer system as shown in FIG. 7.

In embodiments, the reference signal may be from a different oscillator at a different frequency.

An example of processing a figure-8 quadrupole configuration (FIG. 3A) for FOD detection may be as follows:
1. With no FOD present, collect a time-sampled voltage waveform from one of the figure-8 loops
2. Compute the amplitude and phase of the fundamental frequency component (or of its harmonics)
3. Store the amplitude and phase as a baseline reference
4. With FOD present, collect a voltage waveform from the same figure-8 loop
5. Compute the amplitude and phase of the fundamental (or its harmonics)
6. Compare the amplitude and phase to the reference
7. On a polar plot (or in amplitude-and-phase space), if the distance between the signal and the reference exceeds a predetermined threshold, declare a detection of FOD.

In embodiments, the processing of the signal may be performed using analog electronic circuits, digital electronics or both. In embodiments, the signals from multiple sensors may be compared and processed. In embodiments, FOD sensors may reside on only one, or all, or some of the resonators in a wireless power transfer system. In embodiments, the signals from FOD sensors on different resonators may be processed to determine the presence of FOD and/or to give control information to the wireless power system. In embodiments, FOD detection may be controllably turned on and off. In embodiments, FOD detection and processing may be used to control the frequency of the wireless power transfer system, the power level transferred by the wireless power system, and/or the time period when wireless power transfer is enabled and/or disabled. In embodiments, the FOD detectors may be part of a reporting system that may report to a system user that FOD is present and/or that may report to higher level systems that FOD is present or is not present. In embodiments, a FOD detection system may comprise a "learning capability" that may be used to identify certain types of FOD and that may comprise system and/or system feedback to categorize types of FOD as harmless, in danger of heating, not allowed for other reasons, and the like.

In accordance with exemplary and non-limiting embodiments processing may be embedded into the FOD detection subsystem or data may be sent back to a central processor. The processing may compare collected voltage waveforms to reference waveforms and look for statistically significant changes. Those skilled in the art will understand that the waveforms can be compared in amplitude and phase, I or Q components, sine or cosine components, in the complex plane, and the like.

Exemplary Active FOD Detection Embodiments

Two specific and non-limiting embodiments of FOD detection systems that were fabricated are described below. Data have been collected from both embodiments that show them working as FOD detectors.

Figure 8:
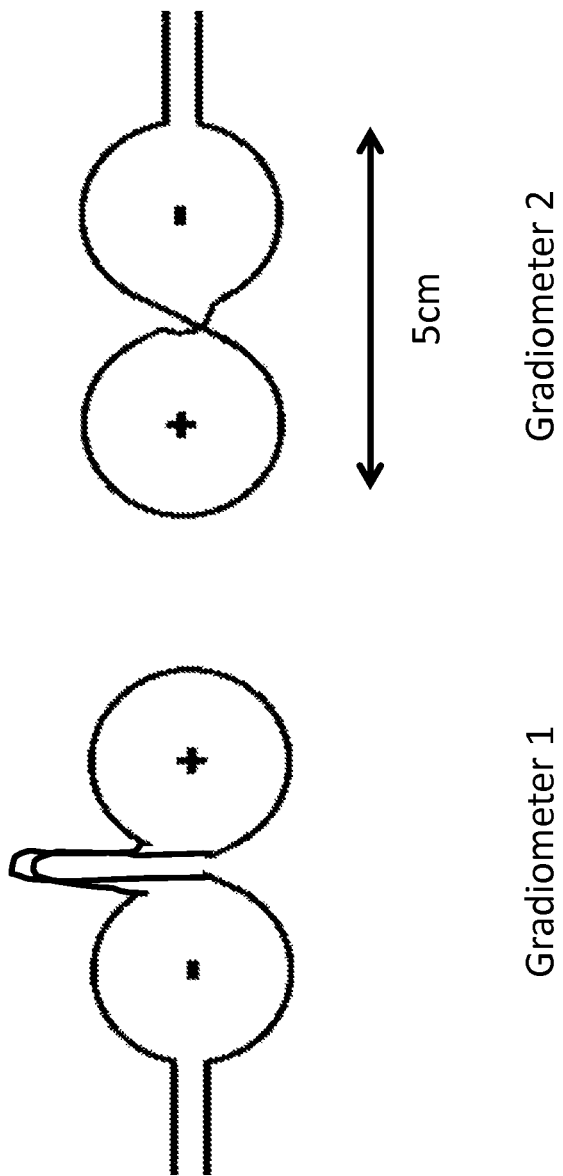
FIG. 8 shows an example embodiment of FOD detector loops.
Figure 9:
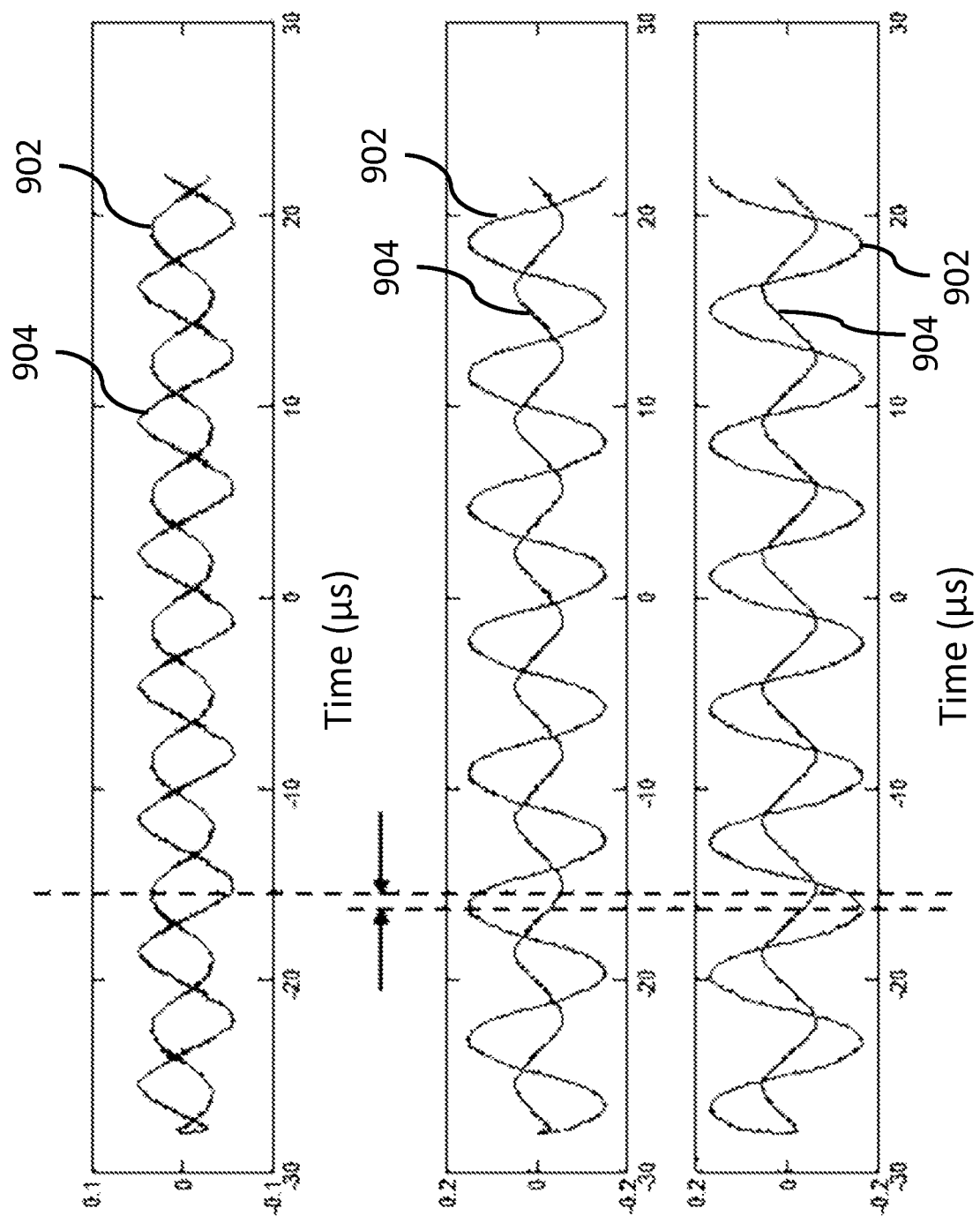
FIGS. 9A-9C shows example voltage measurement curves from a figure-8 gradiometer sensor.

In the first embodiment a stranded wire was formed into a figure-8 loop forming a quadrupole as shown in FIG. 8 with a longer wire between the two loops (gradiometer 1). The second embodiment was designed as shown as gradiometer 2 in FIG. 8. The figure-8 loops were approximately 5 cm long. FIG. 9A-9C show the voltage waveforms collected from the two sensors placed on top of a wireless energy source between the resonators for a 3.3-kW wireless energy transfer system, when the system was delivering 3.3 kW to a load. FIG. 9A shows the small residual voltage (~30 $mV_{rms}$) on the two gradiometers pictured FIG. 8. The residual voltage is due to a combination of non-uniform magnetic field, slight variations in lobe area, and electrical interference. Results from gradiometers #1 and #2 are plotted in as curve 904 and curve 902, respectively. When a metallic chewing gum foil is placed on the right lobe of gradiometer #2, some flux is blocked and a substantial amplitude increase and slight phase shift is observable in FIG. 9B, curve 902. Conversely, when the foil is moved to the left lobe of gradiometer #2, the amplitude stays the same but the phase changes by 180° as shown in FIG. 9C. These changes in phase and amplitude readings may be used to detect the presence of FOD on the sensors.

An embodiment of the figure-8 sensors was also fabricated using printed-circuit board (PCB) techniques to realize the sensor coils or loops. This embodiment may have advantages including low cost, higher fill factor (since the loops can be made into any shape and easily tiled using standard PCB processing techniques), higher uniformity, higher reproducibility, small size and the like. A higher-fill factor was obtained using tiled rectangular loops for a 16-channel array of single figure-8 sensors. The printed loops were highly uniform resulting in smaller (and flatter) baseline readings from the sensors when no FOD was present.

Other Embodiments

In embodiments the sensors and gradiometer sensors described above can be combined with other types of FOD sensors to improve detection likelihood and lower false alarms (system detects FOD when no FOD is present). For example, an array of temperature sensors can be integrated into the resonator assembly. If a piece of FOD begins to heat up it would disturb the normally expected spatial temperature distribution. That deviation can be used to send an alarm to the system controller. In embodiments, the temperature sensor may be used alone or in combination with a metal object sensor and/or it may be used as a backup or confirming sensor to the metallic object sensor.

Living beings such as pets can be difficult to detect. In general, they may not interact in a substantial manner with the magnetic field. In addition, living beings may not heat up appreciably when exposed to magnetic fields. Nonetheless, a wireless power system may need to shut down if living beings intrude into magnetic fields of certain field strengths. The field strength limits may be frequency dependent and may be based on regulatory limits, safety limits, standards limits, public perception limits, and the like. In embodiments, a dielectric sensor that measures changes in the fringe capacitance from a conductor such as a long wire can detect the proximity of living beings. In embodiments, this type of sensor may be used during diagnostic testing, prior to wireless energy transfer, and during wireless energy transfer.

Applications to Vehicle Charging

Detection of FOD may be an important safety precaution in many types of wireless energy transfer systems. For the example of a 3.3-kW car charging system, an example of an embodiment follows.

Figure 10:
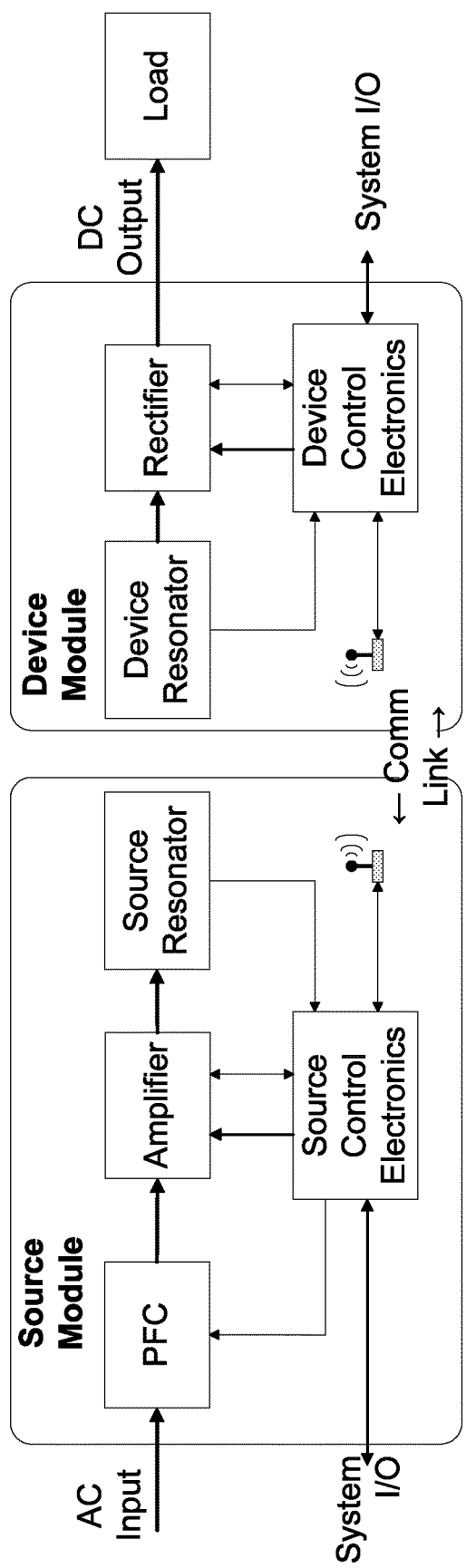
FIG. 10 shows a block diagram of an exemplary EV charger system.

A block diagram of an exemplary EV Charger System is shown in FIG. 10. The system may be partitioned into a Source Module and a Device Module. The Source Module may be part of a charging station and the Device module may be mounted onto an electric vehicle. Power is wirelessly transferred from the Source to the Device via the resonators. Closed loop control of the transmitted power may be performed through an in-band and/or out-of-band RF communications link between the Source and Device Modules.

A FOD detector system (not shown) can be integrated into the system in a variety of places. In embodiments, FOD systems may be integrated into the Source Module, into the source resonator, into the housings or enclosures of the source resonator and the like. In other embodiments, the FOD systems may be integrated on the device side of the system. In other embodiments, FOD systems may be implemented on both the source and device sides of the wireless power transmission system. In embodiments, the FOD detection system may include multiple sensors and a processor with a discrimination algorithm. The processor can be connected to an interface that functions as an interlock in the Source control electronics. Other FOD detector systems may be connected to the charger systems through an additional interface or through an external interface. Local I/O at each module may provide interface for system level management and control functions in a wireless power system utilizing FOD detection.

The source resonator in a high power (3.3+ kW) vehicle charging system may have its highest magnetic field density near the boundaries of the windings and, optionally, any magnetic material. In this area, an array comprising multiple channels of double-figure 8 coils with rectangular-shaped lobes can protect against inadvertent heating of metallic FOD. The array may be fabricated on a PCB and may have integrated filtering and signal conditioning included on the board. A second PCB of equivalent design may be positioned slightly above the first PCB and translated laterally in the manner described in FIG. 4B. An algorithm like that described above may run in an on-board processor whose output may be transmitted to a system controller. The system controller can compare the output of the metallic FOD detector to the outputs of additional FOD detectors, such as those measuring temperature profiles or dielectric changes. The system can then decide whether to turn down or shut down the system if FOD is detected.

Some possible operation modes of a FOD detection system are as follows:
  Low-power diagnostic tests can be performed without the vehicle present to check health and status of the charging station (infrequent) and to check for FOD prior to a vehicle driving over the source (more frequent).
  After the vehicle arrives and is positioned over the source module, but prior to high-power charging, the FOD detector may verify that the source is still free of FOD.
  During high-power charging the FOD detector can verify that no additional FOD has moved onto the coil.

While the invention has been described in connection with certain preferred embodiments, other embodiments will be understood by one of ordinary skill in the art and are intended to fall within the scope of this disclosure, which is to be interpreted in the broadest sense allowable by law. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

Note too, that the techniques described here may be applied to any wireless power system that transmits power using electromagnetic fields. In cases where we have described source and device resonators of highly resonant wireless power systems, one of skill in the art will understand that the same sensors, detectors, algorithms, subsystems and the like could be described for inductive systems using primary and secondary coils.

All documents referenced herein are hereby incorporated by reference.

What is claimed is:

1. A wireless energy transfer system with foreign object debris detection, the system comprising:
  a wireless energy transfer source comprising a source resonator configured to generate an oscillating magnetic field; and
  a foreign object debris detection system comprising:
    at least one magnetic field sensor; and
    at least one readout circuit configured to measure one or more electrical parameters of at the at least one magnetic field sensor,
  wherein the at least one magnetic field sensor is positioned within the magnetic field of the wireless energy transfer system; and
  wherein the foreign object debris detection system is configured to verify that foreign object debris has not moved onto or over the source resonator during generation of the oscillating magnetic field.

2. The system of claim 1, wherein the wireless energy transfer source is configured to generate the oscillating magnetic field to transfer energy to a vehicle.

3. The system of claim 2, wherein the foreign object debris detection system is configured to verify that foreign object debris has not moved onto or over the source resonator prior to a transfer of energy from the source resonator to the vehicle.

4. The system of claim 3, wherein the foreign object debris detection system is configured to perform a health and/or status check of the wireless energy transfer source before the vehicle is positioned over the source resonator.

5. The system of claim 4, wherein the foreign object debris detection system is configured to perform the health and/or status check less frequently than the verification that foreign object debris has not moved onto or over the source resonator prior to a transfer of energy from the source resonator to the vehicle.

6. The system of claim 4, wherein the foreign object debris detection system is configured to periodically perform the health and/or status check and the verification that foreign object debris has not moved onto or over the source resonator prior to a transfer of energy from the source resonator to the vehicle.

7. The system of claim 2, wherein the foreign object debris detection system is configured to verify that foreign object debris has not moved onto or over the source resonator after the vehicle is positioned over the source resonator and prior to a transfer of energy from the source resonator to the vehicle.

8. The system of claim 1, wherein the foreign object debris detection system is configured to verify that foreign object debris has not moved onto or over the source resonator prior to generation of the oscillating magnetic field.

9. The system of claim 1, wherein the wireless energy transfer source is a component of a vehicle charging station.

10. The system of claim 9, further comprising a device module configured to be mounted on an electric vehicle.

11. The system of claim 1, wherein the foreign object debris detection system is integrated into the wireless energy transfer source.

12. The system of claim 1, further comprising an enclosure housing at least a portion of the wireless energy transfer source, wherein the foreign object debris detection system is integrated into the enclosure.

13. The system of claim 1, wherein the wireless energy transfer source is configured to deliver a power of more than 3.3 kW to a wireless power receiving device.

14. The system of claim 1, wherein:
the at least one magnetic field sensor comprises a first conductive loop and a second conductive loop having a maximum dimension larger than a maximum dimension of the first conductive loop;
the first conductive loop is positioned in a first spatial region and the second conductive loop is positioned in a second spatial region different from the first spatial region; and
an amplitude of the oscillating magnetic field in the first spatial region is larger than an amplitude of the oscillating magnetic field in the second spatial region.

15. The system of claim 1, wherein:
the at least one magnetic field sensor comprises a first conductive loop and a second conductive loop having a maximum dimension larger than a maximum dimension of the first conductive loop;
the first conductive loop is positioned in a first spatial region and the second conductive loop is positioned in a second spatial region different from the first spatial region; and
a spatial variation of the oscillating magnetic field in the first spatial region is larger than a spatial variation of the oscillating magnetic field in the second spatial region.

16. A method of detecting foreign object debris in a wireless energy transfer system, the method comprising:
performing a health and/or status check of a source resonator of the wireless energy transfer system;
verifying that no foreign object debris has moved onto or over the source resonator;
positioning a vehicle over the source resonator;
verifying that no foreign object debris has moved onto or over the source resonator;
generating an oscillating magnetic field using the source resonator to transfer energy wirelessly to the vehicle to charge a battery of the vehicle; and
verifying that no foreign object debris has moved onto or over the source resonator during the transfer of energy.

* * * * *

UNITED STATES PATENT AND TRADEMARK OFFICE
CERTIFICATE OF CORRECTION

PATENT NO. : 10,027,184 B2
APPLICATION NO. : 15/170397
DATED : July 17, 2018
INVENTOR(S) : Simon Verghese et al.

Page 1 of 1

It is certified that error appears in the above-identified patent and that said Letters Patent is hereby corrected as shown below:

Column 12
Line 18, in Claim 1, after "of" delete "at"

Signed and Sealed this
Twenty-fifth Day of September, 2018

Andrei Iancu
*Director of the United States Patent and Trademark Office*

(12) INTER PARTES REVIEW CERTIFICATE (4091st)
United States Patent
Verghese et al.

(10) Number: US 10,027,184 K1
(45) Certificate Issued: Aug. 7, 2025

(54) FOREIGN OBJECT DETECTION IN WIRELESS ENERGY TRANSFER SYSTEMS

(71) Applicants: Simon Verghese; Katherine L. Hall; Morris P. Kesler; Herbert T. Lou

(72) Inventors: Simon Verghese; Katherine L. Hall; Morris P. Kesler; Herbert T. Lou

(73) Assignee: WITRICITY CORPORATION

Trial Number:

IPR2024-00105 filed Oct. 27, 2023

Inter Partes Review Certificate for:

Patent No.: 10,027,184
Issued: Jul. 17, 2018
Appl. No.: 15/170,397
Filed: Jun. 1, 2016

The results of IPR2024-00105 are reflected in this inter partes review certificate under 35 U.S.C. 318(b).

INTER PARTES REVIEW CERTIFICATE
U.S. Patent 10,027,184 K1
Trial No. IPR2024-00105
Certificate Issued Aug. 7, 2025

AS A RESULT OF THE INTER PARTES REVIEW PROCEEDING, IT HAS BEEN DETERMINED THAT:

Claims 1-13 and 16 are cancelled.

\* \* \* \* \*